(12) United States Patent
Satoh

(10) Patent No.: US 12,316,245 B2
(45) Date of Patent: May 27, 2025

(54) SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 350 days.

(21) Appl. No.: 18/148,639

(22) Filed: Dec. 30, 2022

(65) Prior Publication Data

US 2023/0299691 A1    Sep. 21, 2023

(30) Foreign Application Priority Data

Mar. 17, 2022    (JP) .................................. 2022-042382

(51) Int. Cl.
*H02M 7/53*      (2006.01)
*H02M 1/00*      (2006.01)
*H02M 1/08*      (2006.01)
*H02M 7/537*     (2006.01)

(52) U.S. Cl.
CPC ......... *H02M 7/537* (2013.01); *H02M 1/0051* (2021.05); *H02M 1/08* (2013.01)

(58) Field of Classification Search
CPC ............................ H02M 1/0051; H02M 7/537
See application file for complete search history.

(56) References Cited

U.S. PATENT DOCUMENTS

| | | | |
|---|---|---|---|
| 5,661,644 A | 8/1997 | Bergman et al. | |
| 2016/0164413 A1* | 6/2016 | Akiyama | H03K 17/165 323/271 |
| 2017/0110448 A1* | 4/2017 | Prechtl | H10D 64/411 |
| 2017/0302182 A1 | 10/2017 | Shimizu et al. | |
| 2017/0338815 A1* | 11/2017 | Laven | H10D 8/422 |
| 2019/0115850 A1* | 4/2019 | Fujimoto | H10D 62/393 |

FOREIGN PATENT DOCUMENTS

| | | |
|---|---|---|
| JP | 3804978 B2 | 8/2006 |
| JP | 2017-195259 A | 10/2017 |
| JP | 2018-082575 A | 5/2018 |
| JP | 2018-182881 A | 11/2018 |

OTHER PUBLICATIONS

An Office Action; "Notice of Reasons for Refusal," mailed by the Japanese Patent Office on Jan. 7, 2025, which corresponds to Japanese Patent Application No. 2022-042382 and is related to U.S. Appl. No. 18/148,639; with English language translation.

* cited by examiner

*Primary Examiner* — Jue Zhang
*Assistant Examiner* — Lakaisha Jackson
(74) *Attorney, Agent, or Firm* — Studebaker Brackett PLLC

(57) ABSTRACT

The semiconductor device includes: a transistor, and a body diode included in the transistor so that the body diode is anti-parallel to the transistor, and a diode anti-parallel connected to the bidirectional current-conduction device, wherein the bidirectional current-conduction device allows a first current and a second current to flow, and allows at least the second current to switch between conduction and non-conduction, the first current flowing in a first direction from a first main electrode of the transistor to a second main electrode facing the first main electrode, the second current flowing through the body diode in a second direction opposite to the first direction, and the diode is smaller in area than the bidirectional current-conduction device in a plan view.

22 Claims, 11 Drawing Sheets

F I G. 1
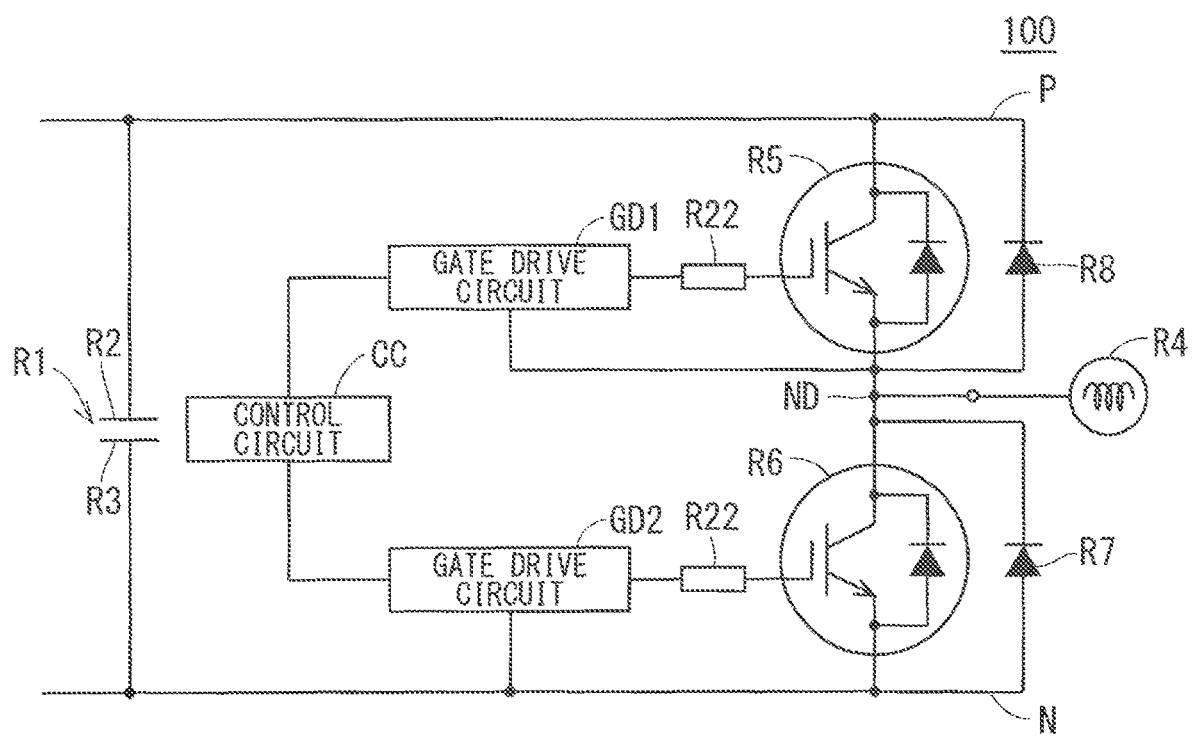

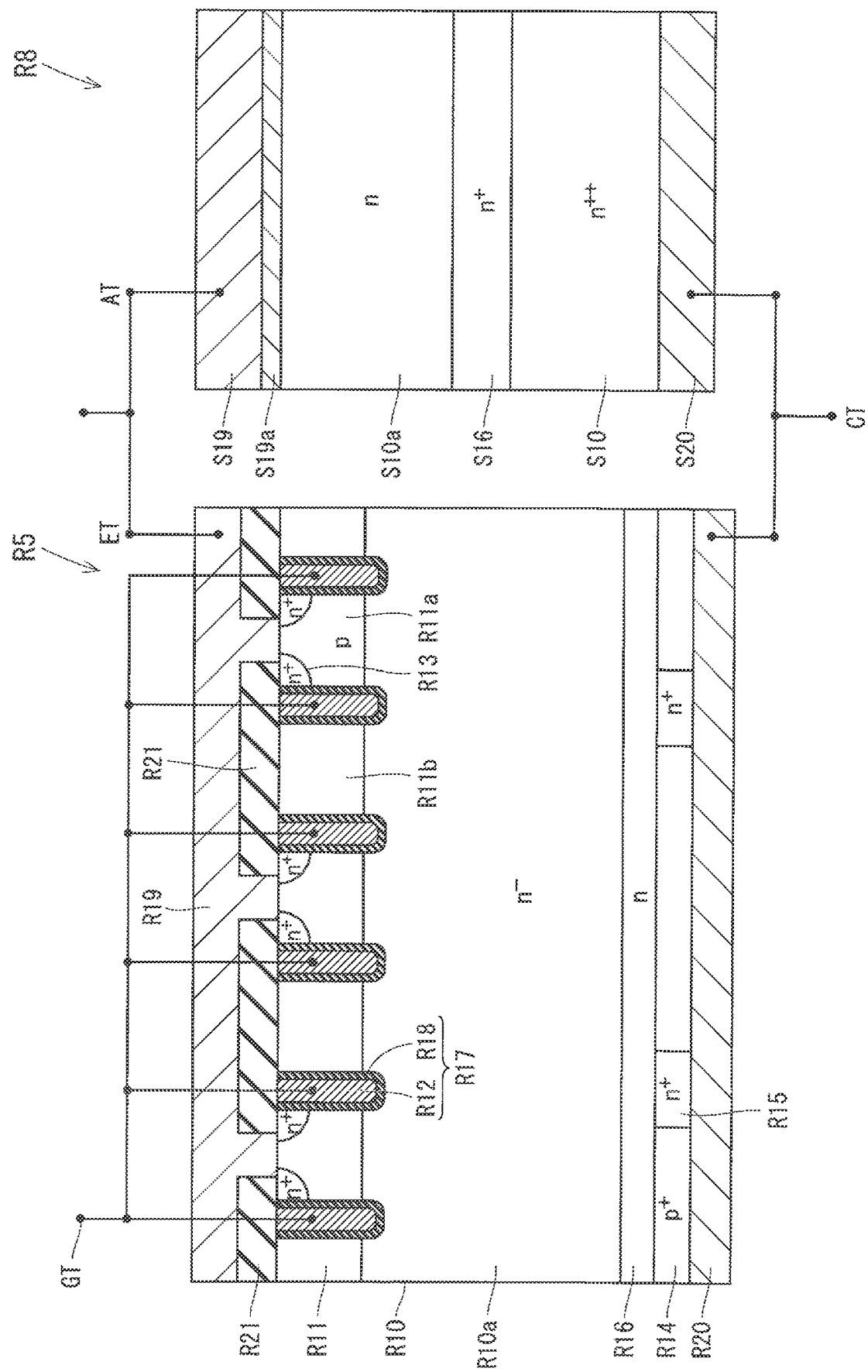
F I G. 2

F I G. 4
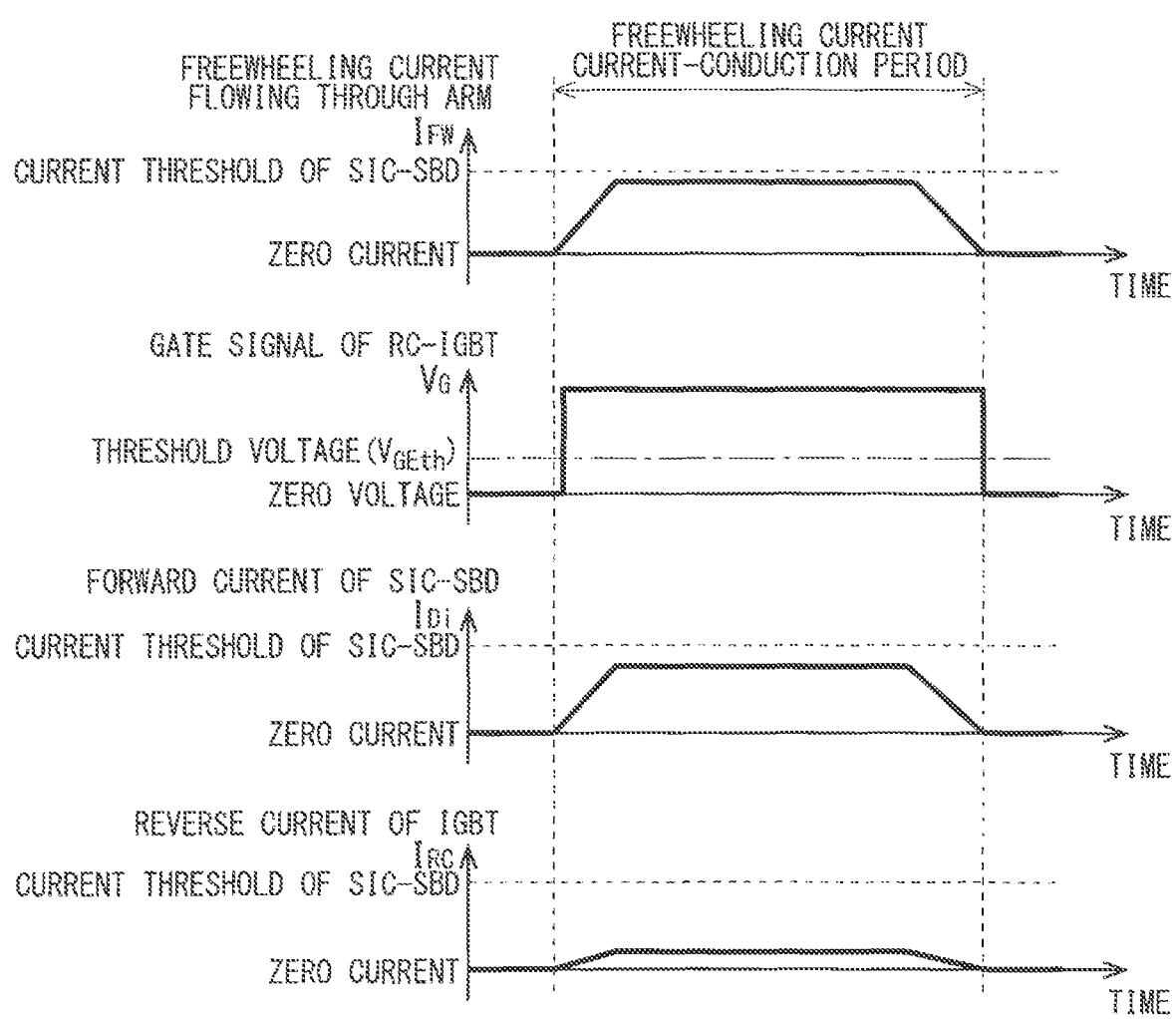

F I G. 5
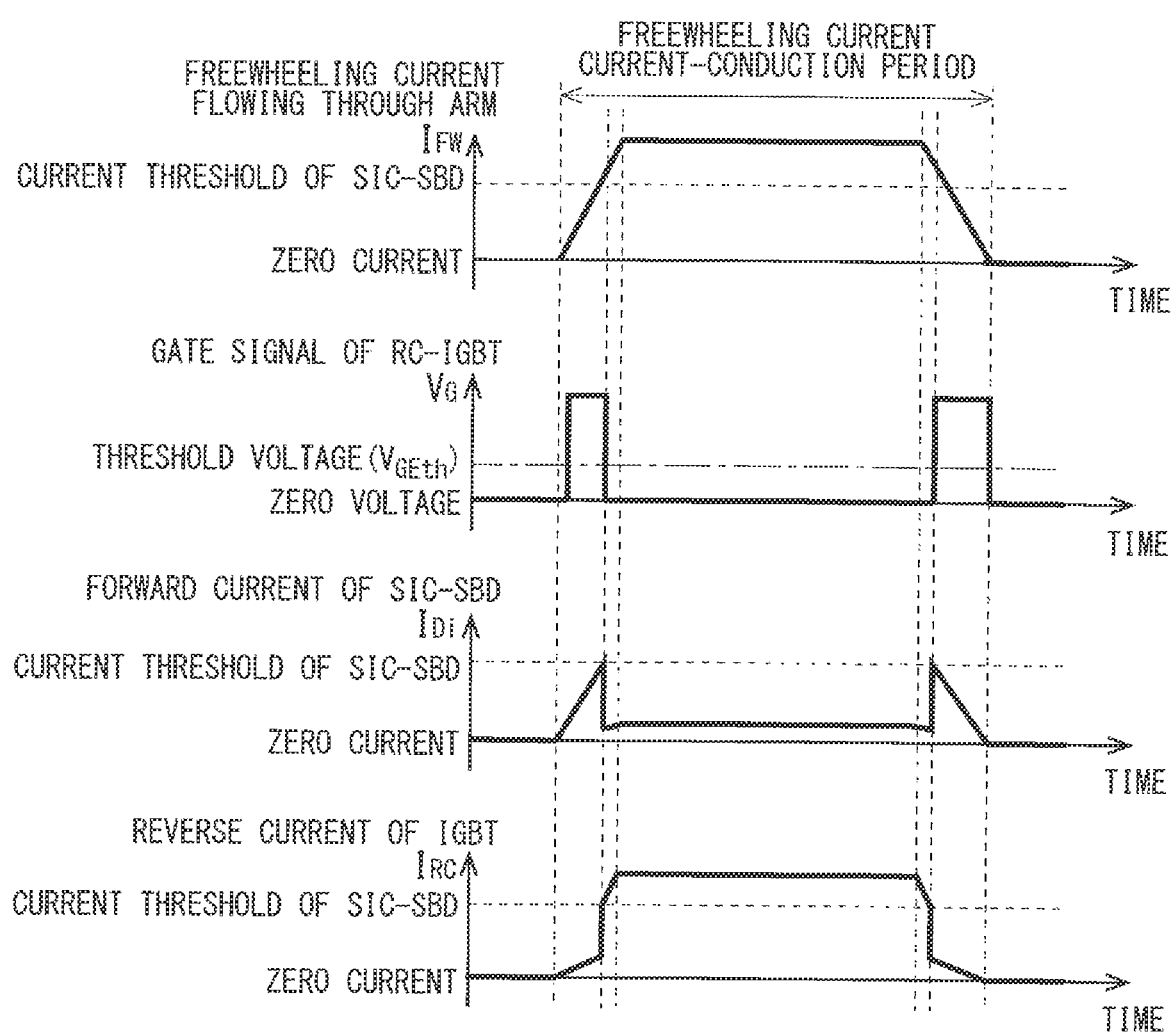

FIG. 8

| GATING RC-IGBTS | STATES OF RC-IGBTS AND SIC-SBDS | | OPERATION CHARACTERISTICS |
| --- | --- | --- | --- |
| | RC-IGBTS | SIC-SBDS | |
| SUPPLY OFF SIGNAL (OR NO SIGNAL) | VOLTAGE-BLOCKING STATE IN OFF STATE | BLOCK VOLTAGE IN REVERSE BIAS STATE | NO CURRENT FLOWS THROUGH LOAD |
| SUPPLY ON SIGNAL | CONDUCT CURRENT FROM COLLECTOR TO EMITTER IN ON STATE | | • ON CURRENT FLOWING THROUGH RC-IGBTS FLOWS THROUGH LOAD |
| SUPPLY ON SIGNAL | CONDUCT ELECTRON CURRENT FROM EMITTER TO COLLECTOR THROUGH CHANNEL IN REVERSE-CONDUCTING STATE | CONDUCT FORWARD CURRENT (FREEWHEELING CURRENT) | • FREEWHEELING CURRENT FLOWING FROM LOAD TO POWER SUPPLY IS BRANCHED INTO RC-IGBTS AND SBDS. SINCE RESISTANCE THROUGH CHANNEL OF RC-IGBTS IS LARGE, MOST OF CURRENT FLOWS THROUGH SBDS.<br>• RC-IGBTS DO NOT PERFORM BIPOLAR OPERATIONS EVEN WITH TRANSITION FROM CURRENT-CONDUCTION STATE TO REVERSE RECOVERY OPERATIONS. THUS, REVERSE RECOVERY LOSS IS SMALL. |
| SUPPLY OFF SIGNAL (OR NO SIGNAL) | CONDUCT ELECTRON CURRENT AND HOLE CURRENT FROM EMITTER TO COLLECTOR THROUGH BODY DIODE IN REVERSE-CONDUCTING STATE | | • FREEWHEELING CURRENT FLOWING FROM LOAD TO POWER SUPPLY IS BRANCHED INTO RC-IGBTS AND SBDS. MOST FREEWHEELING CURRENT FLOWS THROUGH BODY DIODES OF RC-IGBTS WHOSE FORWARD VOLTAGE DROP IS LOW AND WHICH ARE PERFORMING BIPOLAR OPERATIONS (LARGE CURRENT CAN BE CONDUCTED).<br>• SINCE BODY DIODES OF RC-IGBTS PERFORM BIPOLAR OPERATIONS, REVERSE RECOVERY LOSS IS LARGE |

SEMICONDUCTOR DEVICE

BACKGROUND OF THE INVENTION

Field of the Invention

The present disclosure relates to a semiconductor device, and particularly to a semiconductor device to be applied to a power conversion device.

Description of the Background Art

Examples of semiconductor devices applied to conventional power conversion devices include switching devices, and Schottky barrier diodes (SBDs) anti-parallel connected to the switching devices and containing silicon carbide (SiC) as a base material, which are disclosed in, for example, Japanese Patent No. 3804978.

The Schottky barrier diodes applied to the conventional power conversion devices and anti-parallel connected to the switching devices each contain an expensive wide bandgap semiconductor with a low reverse recovery loss as a base material. Thus, reduction in the reverse recovery loss of the power conversion devices has not become compatible with reduction in the cost yet.

SUMMARY

The object of the present disclosure is to provide a semiconductor device that makes reduction in a reverse recovery loss of a power conversion device compatible with reduction in the cost.

The semiconductor device according to the present disclosure includes: a bidirectional current-conduction device including a transistor, and a body diode included in the transistor so that the body diode is anti-parallel to the transistor; and a diode anti-parallel connected to the bidirectional current-conduction device, wherein the bidirectional current-conduction device allows a first current and a second current to flow, and allows at least the second current to switch between conduction and non-conduction, the first current flowing in a first direction from a first main electrode of the transistor to a second main electrode facing the first main electrode, the second current flowing through the body diode in a second direction opposite to the first direction, and the diode is smaller in area than the bidirectional current-conduction device in a plan view.

In the semiconductor device according to the present disclosure, switching a signal to be supplied to a gate electrode of a transistor when a forward current exceeding a predetermined magnitude flows through a diode allows the current flowing through the diode to be diverged to a bidirectional current-conduction device as a second current. This can prevent the current crowding into the diode, and reduce the risk of thermal breakdown. Thus, the diode can be reduced in area more than the bidirectional current-conduction device in a plan view, and makes reduction in a reverse recovery loss compatible with reduction in the cost when the diode is applied to a power conversion device.

BRIEF DESCRIPTION OF THE DRAWINGS

FIG. 1 is a circuit diagram illustrating an inverter circuit according to Embodiment 1;

FIG. 2 is a cross-sectional view illustrating a structure of a transistor and a diode of the inverter circuit according to Embodiment 1;

FIG. 4 illustrates time charts of a freewheeling current flowing through an arm of the inverter circuit according to Embodiment 1, input of a gate signal, the freewheeling current flowing through the diode, and the freewheeling current flowing through the transistor;

FIG. 5 illustrates time charts of the freewheeling current flowing through the arm of the inverter circuit according to Embodiment 1, input of the gate signal, the freewheeling current flowing through the diode, and the freewheeling current flowing through the transistor;

FIG. 8 illustrates, as a list, gating the inverter circuit according to Embodiment 1, conduction states of the current flowing through the diodes and the transistors, and the operation characteristics;

DESCRIPTION OF THE PREFERRED EMBODIMENTS

Introduction

Figure 3:
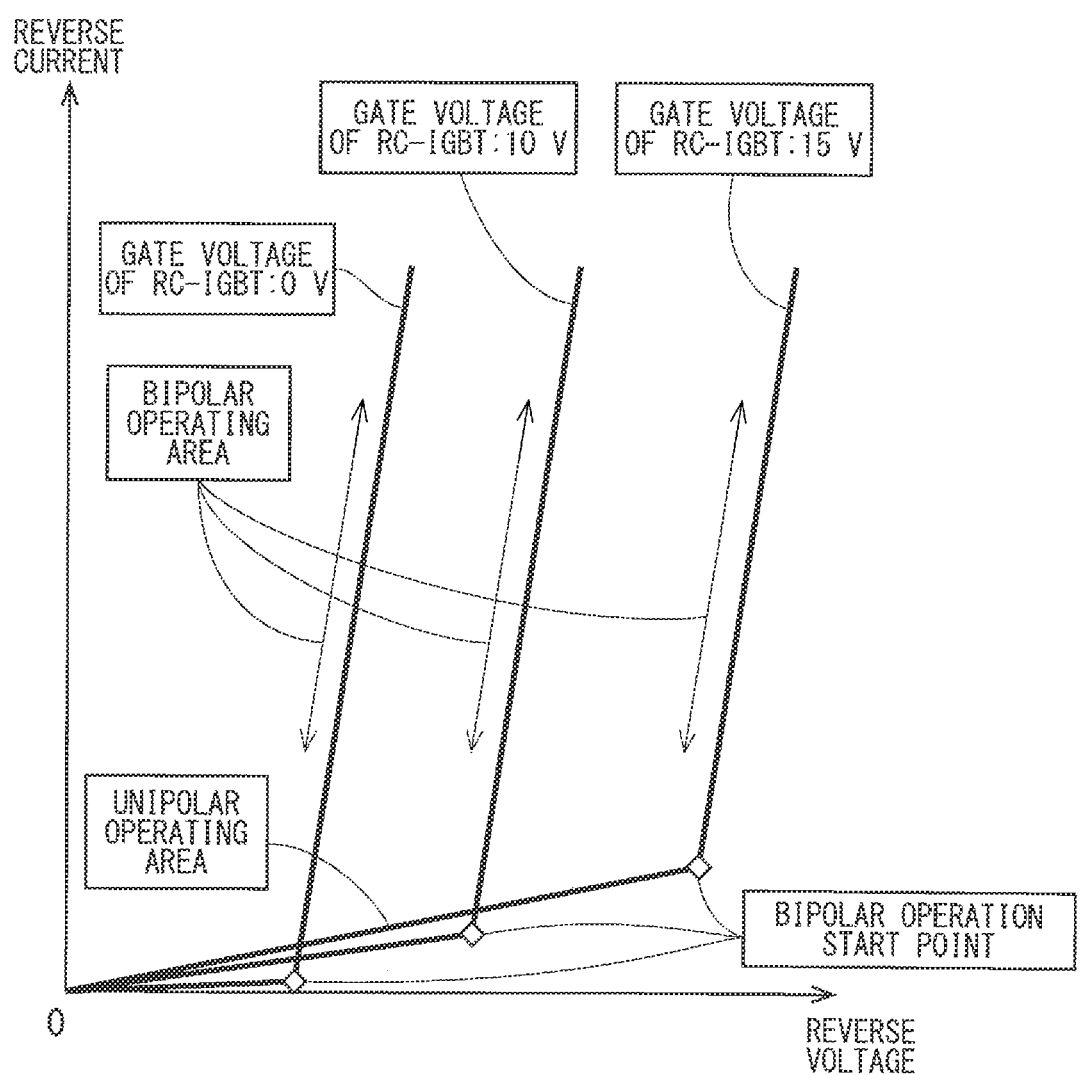
FIG. 3 illustrates dependence of forward voltage-forward current characteristics of diodes included in transistors in the inverter circuit according to Embodiment 1 on gate voltages.

A semiconductor device according to an aspect of the present disclosure is a semiconductor device in which switching devices are anti-parallel connected to freewheeling diodes (FWDs). Here, the switching devices are bidirectional current-conduction devices having a function of bidirectionally conducting current.

Representative bidirectional current-conduction devices include a reverse-conducting (RC) insulated gate bipolar transistor (IGBT) obtained by including functions of a FWD in an IGBT which allows the current to flow in a reverse direction, and a metal-oxide-semiconductor (MOS) field-effect transistor (FET) including the functions of the FWD and allowing the current to flow in a reverse direction as a MOS transistor.

Since the RC-IGBT and the MOSFET contain, as base materials, inexpensive large-diameter silicon (Si) semiconductors, the manufacturing cost can be reduced. Since gate signals are used as voltage signals in the RC-IGBT and the MOSFET, diverging operations can be adjusted by the magnitude of voltages of an ON signal and an OFF signal to be supplied to gate electrodes.

A FWD anti-parallel connected to the RC-IGBT, for example, a Schottky barrier diode (SBD) manufactured from wide band-gap (WBG) semiconducting crystals performs unipolar operations with less reverse recovery charge. The gate electrodes at a negative pole (cathode) of a switching device are connected to a control circuit that supplies a signal for driving the switching device.

A semiconductor device according to the present disclosure is a semiconductor device that detects a forward current flowing through a FWD, that is, a current flowing from a positive pole (an anode) of the FWD to a negative pole (e.g., a freewheeling current), and supplies an OFF signal from the control circuit to the gate electrodes of the switching device and switches from Gate ON to Gate OFF when the freewheeling current exceeds a preset value (a current threshold).

The relationship between the forward current flowing through the FWD and the forward voltage can be approximated by an ideal diode equation of J=Js ($e^{qv/kt}-1$). Here, J denotes a current density, Js denotes a saturated current density, e denotes a Napier's number, q denotes elementary charge, v denotes a voltage, k denotes a Boltzmann constant, and t denotes a temperature. Thus, the semiconductor device according to the present disclosure is also a semiconductor device that detects the forward voltage of the FWD, that is, an anode voltage with respect to the negative pole of the FWD, and supplies the OFF signal from the control circuit to the gate electrodes of the switching device and switches from Gate ON to Gate OFF when the forward voltage exceeds a preset value (a voltage threshold).

The present disclosure provides an inexpensive and downsized semiconductor device in which switching devices are anti-parallel connected to diodes and which can conduct a large current with a low loss.

Embodiment 1

Although n and p denote semiconductor conductivity types and the first conductivity type is n-type and the second conductivity type is p-type in the following description of the present disclosure, conversely, the first conductivity type may be p-type and the second conductivity type may be n-type. Furthermore, n⁻ represents the impurity concentration lower than that of n, n⁺ represents the impurity concentration higher than that of n, and n⁺⁺ represents the impurity concentration higher than that of n. Similarly, p represents the impurity concentration lower than that of p, and p⁺ represents the impurity concentration higher than that of p.

[Device Structure]

FIG. 1 is a circuit diagram illustrating an inverter circuit 100 that is a semiconductor device according to Embodiment 1 of the present disclosure. As illustrated in FIG. 1, the inverter circuit 100 is a single-phase inverter including one phase (leg) of a three-phase AC power supply device for a load R4.

The inverter circuit 100 includes a DC voltage power supply device R1 including a positive electrode R2 and a negative electrode R3. The inverter circuit 100 converts the DC voltage supplied by the DC voltage power supply device R1 into an AC voltage for driving the single-phase load R4 representing an inductance.

In the inverter circuit 100, transistors R5 and R6 that are RC-IGBTs are connected in series with each other between an electric power line P through which a potential (a first potential) of the positive electrode R2 in the DC voltage power supply device R1 is supplied and an electric power line N through which a potential (a second potential) of the negative electrode R3 in the DC voltage power supply device R1 is supplied.

Diodes R8 and R7 that are SBDs containing SiC as a base material are anti-parallel connected to the transistors R5 and R6, respectively.

The transistor R5 connected to the electric power line P is the first arm, and the transistor R6 connected to the electric power line N is the second arm.

Current ratings of the diodes R8 and R7 are approximately less than or equal to halves those of the transistors R5 and R6, respectively. In other words, areas of active regions in a plan view through which forward currents of the diodes R8 and R7 flow are approximately less than or equal to halves areas of active regions in a plan view through which principal currents of the transistors R5 and R6 flow, respectively. Thus, the diodes R8 and R7 functioning as FWDs are sufficiently downsized. Downsizing the diodes R8 and R7 can reduce the cost of using the diodes R8 and R7 containing an expensive wide bandgap semiconductor as a base material.

A connection node ND between the transistors R5 and R6 is connected to the load R4 as an output node.

Gate electrodes of the transistors R5 and R6 are connected to gate drive circuits GD1 and GD2, respectively, through gate resistors R22. The gate drive circuits GD1 and GD2 are connected to a control circuit CC (controller). The control circuit CC supplies the gate drive circuits GD1 and GD2 with signals for controlling ON and OFF of the transistors R5 and R6, respectively.

The gate drive circuit GD1 operates between a potential of a power supply of the gate drive circuit GD1 and a potential of the connection node ND, whereas the gate drive circuit GD2 operates between a potential of the electric power line N and a potential of a power supply of the gate drive circuit GD2.

FIG. 2 is a cross-sectional view illustrating a structure of the transistor R5 and the diode R8. The transistor R6 and the diode R7 have the same structure.

The transistor R5 includes an n-type semiconductor substrate R10 as a base material. A portion functioning as an IGBT (an IGBT element) and a portion functioning as a FWD (a FWD element) are integrated and disposed into the semiconductor substrate R10.

For example, an n-type (n⁻) single crystal bulk silicon substrate (an FZ wafer) whose impurity concentration is approximately $1\times10^{14}$ cm⁻³ is used as the semiconductor substrate R10. This semiconductor substrate R10 functions as an n⁻ type base layer R10a of the IGBT element and a cathode layer of the FWD element (a p-n junction diode).

A p-type base layer R11 of p-type (p) is formed in a surface portion of an upper surface (a first principal surface) of the semiconductor substrate R10 which includes an emitter electrode R19. A plurality of trenches R17 penetrating the p-type base layer R11 from the first principal surface of the semiconductor substrate R10 and each having a bottom reaching into the semiconductor substrate R10 are selectively formed in this p-type base layer R11. An inner surface of each of the trenches R17 is covered with a gate insulating film R18. Each of the trenches R17 covered with the gate insulating film R18 is filled with, for example, polysilicon whose impurity concentration is approximately $1\times10^{20}$ cm⁻³ to form a gate electrode R12. The gate electrode R12 receives a driving signal for driving the IGBT element through a gate terminal GT.

N⁺ type emitter layers R13 of n-type (n⁺) are selectively formed in an upper layer portion of the p-type base layer R11 with a mesa shape partitioned by the trenches R17, to be adjacent to parts of side surfaces of the trenches R17. Each of the n⁺ type emitter layers R13 has a thickness of approximately 0.5 μm, and an impurity concentration of approximately $3\times10^{19}$ cm⁻³.

A p-type base layer R11a (a first p-type base layer) that is a p-type base layer including the n⁺ type emitter layers R13 is distinguished from a p-type base layer R11b (a second p-type base layer) that is a p-type base layer excluding the n⁺ type emitter layers R13. The p-type base layer R11a and the p-type base layer R11b are alternately formed.

The p-type base layers R11a including the n⁺ type emitter layers R13 are electrically connected to the emitter electrode R19. An emitter potential is applied to the emitter electrode R19 through an emitter terminal ET. The p-type base layers R11a connected to the emitter electrode R19 function as a p-type anode layer of the FWD element.

The p-type base layers R11a facing the gate electrodes R12 through the gate insulating films R18 function as a channel formation region of the IGBT element.

Most of the surface of the p-type base layers R11b is covered with an insulating film R21. Only a portion of the surface that is not covered with the insulating film R21 (not illustrated) is connected to the emitter electrode R19 for clamping voltages. The connection area of the portion is small, and the portion has a resistive component.

P⁺ type collector layers R14 of p-type (p⁺) of the IGBT element and n⁺ type collector layers R15 of n-type (n⁺) are selectively formed in a surface portion of a lower surface (a second principal surface) of the semiconductor substrate R10 which includes a collector electrode R20.

Each of the p⁺ type collector layers R14 has a thickness of approximately 0.5 μm, and an impurity concentration of approximately $1 \times 10^{18}$ cm$^{-3}$. Each of the n⁺ type collector layers R15 has a thickness of approximately 0.5 μm, and an impurity concentration of approximately $1 \times 10^{19}$ cm$^{-3}$.

The collector electrode R20 is formed in contact with the top surface of the p⁺ type collector layers R14 and the n⁺ type collector layers R15, which is the lower surface of the semiconductor substrate R10.

An n-type buffer layer R16 of n-type (n) that prevents extension of a depletion layer is formed between the p⁺ type collector layers R14 and the n⁺ type collector layers R15 and the semiconductor substrate R10. A thickness from the top surface of the p-type base layer R11, that is, the upper surface of the semiconductor substrate R10 to the bottom surface of the p⁺ type collector layers R14 and the n⁺ type collector layers R15, that is, the lower surface of the semiconductor substrate R10 is approximately 120 μm.

The diode R8 includes a SiC substrate S10 as a base material. The SiC substrate S10 is a low-resistance substrate of n-type (n⁺) containing many n-type impurities. An n⁺ type buffer layer S16 of n-type (n⁺) is formed closer to the upper surface (first principal surface) including an anode electrode S19 of the SiC substrate S10. A drift layer S10a of n-type (n) is formed on the n⁺ type buffer layer S16. The n⁺ type buffer layer S16 and the n-type drift layer S10a are formed by a crystal growth method, and are approximately 2 μm and 10 μm in thickness, respectively.

Furthermore, a metal film S19a for forming a Schottky barrier is formed on the n-type drift layer S10a of the SiC substrate S10. A metal film functioning as the anode electrode S19 is formed on the metal film S19a. The metal film S19a is made of, for example, titanium (Ti). The anode electrode S19 is made of, for example, aluminum (Al).

A cathode electrode S20 formed on the lower surface (second principal surface) of the SiC substrate S10 is a metal film forming an Ohmic junction with the SiC substrate S10, and is a multilayer obtained by laminating a titanium silicide (TiSi) film, a nickel (Ni) film, and an Al film.

The collector electrode R20 of the transistor R5 and the cathode electrode S20 of the diode R8 are soldered to a metal film on an insulating substrate, which are not illustrated. Then, the collector electrode R20 and the cathode electrode S20 are incorporated into a casing to which, for example, an emitter terminal of the RC-IGBT (an anode terminal of the SiC-SBD), a collector terminal of the RC-IGBT (a cathode terminal of the SiC-SBD), and a gate terminal are attached. Next, the emitter terminal ET of the emitter electrode R19 is electrically connected to an anode terminal AT of the anode electrode S19 via, for example, aluminum wire. The metal film to which the collector electrode R20 and the cathode electrode S20 have been soldered is electrically connected to a collector terminal CT via, for example, aluminum wire. Then, the gate electrodes R12 are electrically connected to the gate terminal GT via, for example, aluminum wire.

Next, for example, the RC-IGBTs, the SiC-SBDs, and the aluminum wire are covered with a resin such as silicone gel. Then, a lid is put on the casing so that the components are packaged, thus completing the inverter circuit 100.

Here, the diodes R8 and R7 that are SiC-SBDs can be SBDs containing, as a base material, gallium nitride (GaN) that is a representative wide bandgap semiconductor material other than SiC. In p-n junction diodes other than SBDs, the n-type drift layer S10a with a low impurity concentration which shares a voltage in blocking a voltage can be thinned, because a WBG semiconductor device is higher in breakdown field strength than a Si semiconductor device. This can reduce the amount of aggregate carriers accumulated in the n-type drift layer S10a when the current is conducted, and reduce the reverse recovery loss.

Thus, the two diodes R7 and R8 function as FWDs, and have reverse voltage blocking capabilities (voltage ratings) almost equivalent to off voltages (voltage ratings) of the transistors R5 and R6.

[Functions]

Functions of the inverter circuit 100 will be hereinafter described with reference to FIGS. 1 and 2. The transistor R5 is turned ON and OFF at a high frequency during a first positive half period of the AC voltage generated by the inverter circuit 100 for the load R4. When the transistor R5 becomes conducting (an ON state), that is, when the control circuit CC supplies an ON signal to the gate electrodes R12 to allow an ON current to flow from the collector electrode R20 to the emitter electrode R19, the voltage across the main electrodes of the transistor R5 is small. Most of the voltage of the DC voltage power supply device R1 is applied to the main electrodes across each of the diode R7 and the transistor R6. Thus, the diode R7 and the transistor R6 are in their reverse blocking state (an OFF state).

The voltages applied to the main electrodes across the transistor R5 and the diode R7 are, for example, several volts and from several hundred volts to several kilovolts, respectively. The ON current of the transistor R5 flows to the load R4 When the transistor R5 is in an OFF state, that is, when the control circuit CC supplies an OFF signal to the gate electrodes R12 to interrupt the current flowing from the collector electrode R20 to the emitter electrode R19, the load R4 representing the inductance attempts to continue to conduct the same current as before. A body diode of the transistor R6 from which an OFF signal is supplied to the diode R7 and the gate electrodes R12 reaches a bipolar operating area and allows a freewheeling current to flow as a FWD. The freewheeling current turns ON switching the transistor R6 with current increments in time (dIon/dt) as much as current decrements in time (dIoff/dt) in turning OFF switching the transistor R5. This allows the same current before turning OFF the transistor R5 to flow through the load R4.

It is preferred to transition the transistor R5 immediately to an OFF state to maintain a small switching loss. However, such transition increases the dIoff/dt, and immediately increases the freewheeling currents flowing through the diode R7 and the diode included in the transistor R6. This generates a large surge current, and increases the risk of destroying the device. Thus, the dIoff/dt that turns OFF the transistor R5 is adjusted and controlled by the gate resistor R22 inserted between the gate electrodes R12 and the control circuit CC.

The freewheeling current is branched into the diode R7 and the transistor R6 and flows. When the transistor R5 transitions to an ON state again, the diode R7 and the transistor R6 transition to an OFF state with the dIoff/dt as much as the dIon/dt when the transistor R5 transitions to the ON state.

When the transistor R5 is in a complete ON state, the voltage across the transistor R5 is low. The transistor R5 biases the diode R7 in a reverse direction with the principal voltage, that is, a voltage as high as 1 kilovolt or several kilovolts, and forward-biases the transistor R6. Electrons in the diode R7 and electrons and holes in the body diode of the transistor R6, which are carriers that allow the freewheeling current to flow, are reverse biased relative to the FWDs, that is, the IGBT of the RC-IGBT and the body diode. The forward-bias of the RC-IGBT is reverse biased relative to the body diode, generates the reverse recovery loss in the diode R7 and the body diode of the transistor R6, and increases the turn-on switching loss of the transistor R5. This is because the reverse recovery current of the diode R7 and the body diode of the transistor R6 are superimposed on the turn-on current flowing through the transistor R5.

The transistor R5 is switched between ON and OFF several times at short intervals during the first positive half period of the AC voltage. Repeatedly switching the transistor R6 between ON and OFF to generate a second negative half period of the AC voltage to be supplied to the load R4 allows the freewheeling current to flow from the load R4 alternately to the diode R8 and the body diode of the transistor R5.

Behaviors of the transistor R6, the diode R8, and the body diode of the transistor R5 are identical to those when the transistor R5, the diode R7, and the body diode of the transistor R6 are switched between ON and OFF. Such operations are general operations of the inverter circuit 100.

In the inverter circuit 100 with such operations, the freewheeling current is branched into the diodes R8 and R7, and the body diodes of the transistors R5 and R6, and flows. Thus, the conducting capabilities of the diodes R7 and R8 can be reduced. Particularly, using not Schottky barrier diodes but junction diodes with high conducting capabilities as the body diodes of the transistors R5 and R6 can reduce the risk of thermal breakdown caused by overcurrent even when the diodes R7 and R8 are further downsized.

Moreover, using the junction diodes as the body diodes of the transistors R5 and R6 accumulates electrons and holes in conducting the freewheeling current, increases the reverse recovery loss when the transistors are turned OFF, that is, increases the reverse recovery charge and the reverse recovery current, and also increases the turn-on switching loss of the transistors R5 and R6. However, the freewheeling current is branched into the diodes R7 and R8 with extremely small reverse recovery loss, that is, extremely small reverse recovery charge and reverse recovery current. Thus, the turn-on switching loss of the transistors R5 and R6 is smaller by the amount of the branched current than that without the diodes R7 and R8.

The lifetime control technique through charged particle irradiation with, for example, electron beams is applied to reduce the switching loss of the body diodes of the transistors R5 and R6. However, this lifetime control applied to the transistors R5 and R6 increases the ON voltage of the IGBTs.

The lifetime control should be applied only to the body diodes of the transistors R5 and R6. However, since the transistors R5 and R6 include both of the IGBTs and the body diodes, it is difficult to apply the lifetime control only to the body diodes.

When the impurity concentration of the p-type base layers R11a that function as the anode layer of each of the body diodes of the transistors R5 and R6 is reduced to less than or equal to $5 \times 10^{17}$ cm$^{-3}$, the amount of accumulated carriers in the n-type drift layer S10a in conducting the freewheeling current can be reduced. However, this increases the forward voltage of the body diodes of the transistors R5 and R6 and the ON voltage of the transistors R5 and R6. Thus, this method is not effective.

Hereinafter, a control method for further reducing the loss without sacrificing the forward voltage of the body diodes of the transistors R5 and R6 even after the impurity concentration of the p-type base layers R11a is set to more than or equal to $6 \times 10^7$ cm$^{-3}$ will be described.

FIG. 3 schematically illustrates dependence of reverse voltage-reverse current characteristics of the transistors R5 and R6 through which the freewheeling current flows, that is, forward voltage-forward current characteristics of the body diodes on the gate voltages. The horizontal axis represents the reverse voltage, and the vertical axis represents the reverse current.

As illustrated in FIG. 3, the forward voltage-forward current characteristics of the body diodes of the transistors R5 and R6 are changed depending on the magnitude of the voltage signal (gate voltage) to be supplied to the gate electrodes R12.

FIG. 3 illustrates three characteristics when the gate voltages are 0 V (volt), 10 V, and 15 V. FIG. 3 illustrates, for each of the characteristics, a bipolar operating area indicated by an arrow and a unipolar operating area.

According to FIG. 3, as the gate voltage to be supplied is higher, the voltage with which a current starts to flow, that is, the voltage at a bipolar operation start point is increased, thus increasing the forward voltage. When the gate voltage to be supplied is lower or a zero voltage, the voltage with which the current starts to flow (the voltage at the bipolar operation start point) is approximately 0.7 volt, thus reducing the forward voltage.

Changing the current flowing through the body diodes of the transistors R5 and R6 depending on the magnitude of the gate voltage to be supplied to the transistors R5 and R6 can change a current ratio of the current branching into the diodes R8 and R7, and the transistors R5 and R6.

The control method according to the present disclosure is detecting the freewheeling currents flowing through the diodes R8 and R7 included in the inverter circuit 100, and gating the inverter circuit 100 for changing the gate signals to be supplied to the transistors R6 and R5 anti-parallel connected to the diodes R7 and R8, respectively, when the detected freewheeling current exceeds a current threshold.

FIGS. 4 and 5 illustrate time charts of the freewheeling current flowing through an arm, input of a gate signal, the freewheeling current (forward current) flowing through the FWD, and the freewheeling current (reverse current) flowing through the RC-IGBT. FIG. 4 illustrates a case where the freewheeling current flowing through the FWD is smaller than the current threshold, and FIG. 5 illustrates a case where the freewheeling current flowing through the FWD exceeds the current threshold.

FIGS. 4 and 5 illustrate the time charts of the freewheeling current $I_{FW}$ flowing through the arm, the gate signal $V_G$ of the RC-IGBT, the forward current $I_{Di}$ of the SiC-SBD, and the reverse current $I_{RC}$ of the RC-IGBT in order from the top. The freewheeling current $I_{FW}$ is a sum ($I_{Di}+I_{RC}$) of the forward current $I_{Di}$ and the reverse current $I_{RC}$.

In FIGS. 4 and 5, the current threshold of the SiC-SBD is indicated by a broken line in the time charts of the freewheeling current flowing through the arm, the forward current of the SiC-SBD, and the reverse current of the RC-IGBT. The threshold voltage $V_{GEth}$ is indicated by an alternate long and short dashed line in the time charts of the gate signal of the RC-IGBT.

As illustrated in FIG. 4, when the freewheeling current is smaller than the set current threshold, continuing to supply the gate signal exceeding the threshold voltage $V_{GEth}$ allows most of the freewheeling current to flow through the SiC-SBD as the forward current, and allows a part of the freewheeling current to flow as the reverse current of the RC-IGBT (a current flowing through a gate channel). Here, an ON signal whose voltage has been adjusted is supplied to the gate electrodes R12 so that the freewheeling current flowing through the SiC-SBD falls slightly below the current threshold. Here, "falls slightly below the current threshold" means controlling the freewheeling current within a range from 70% to 90% of the current threshold.

The inverter circuit 100 is controlled by adjusting a branching ratio of the freewheeling currents flowing through the diodes R8 and R7 and the freewheeling currents flowing through the FWDs included in the transistors R5 and R6 using the ON signal to be supplied to the gate electrodes R12, so that the freewheeling currents flowing through the diodes R8 and R7 are maximized to the extent that causes no risk of thermal breakdown.

As illustrated in FIG. 5, when the freewheeling current exceeds the set current threshold, supply of the gate signal is stopped with the timing at which the freewheeling current exceeds the current threshold. This allows a part of the freewheeling current to flow as the reverse current of the RC-IGBT (a current flowing through a junction of the body diode), and allows a part of the freewheeling current to flow through the SiC-SBD as the forward current. Furthermore, when the freewheeling current is smaller than the set current threshold, the gate signal exceeding the threshold voltage $V_{GEth}$ is supplied with the timing at which the freewheeling current is smaller than the set current threshold to change the current ratio.

In the conducting operations of the freewheeling current through the diode R8, when the current flowing through the diode R8 is detected and the forward current (freewheeling current) flowing through the diode R8 does not exceed the set current threshold, the gate channel is turned ON by supplying the ON signal of 15 V from the control circuit CC to the gate electrodes R12 of the transistor R5. This allows the reverse current (freewheeling current) to flow from the emitter electrode R19 to the collector electrode R20 through the gate channel.

The timing at which the ON signal is supplied to the gate electrodes R12 is the timing after initiating the freewheeling current flow through the diode R8 and after the voltage between the main electrodes of the transistor R6 of the paired arm reaches the power supply voltage. FIG. 4 illustrates this timing as the rise timing of a gate signal waveform in the time chart of the gate signal of the RC-IGBT. When the ON signal is supplied to the gate electrodes R12 of the transistor R5 before the transistor R6 shares the power supply voltage, the leg is sometimes short-circuited. This will be further described later.

When the gate channel is turned ON, the emitter electrode R19 (identical in potential to the p-type base layers R11a) and the n⁻ type base layer R10a attempt to operate at the same potential through a gate channel resistance. This hardly forward-biases the p-n junction functioning as the body diode of the transistor R5, that is, the junction between the p-type base layers R11a and the n⁻ type base layer R10a.

Consequently, the ON resistance of the diode R8 (the forward voltage (volt)/the forward current (ampere)) is smaller than a sum of resistive components of the emitter electrode R19, the n⁺ type emitter layers R13, the gate channel, the n⁻ type base layer R10a, the n-type buffer layer R16, the n⁺ type collector layers R15, and the collector electrode R20 in a current path of the transistor R5. Thus, the freewheeling current is shared, so that most of the freewheeling current flows through the diode R8 as illustrated in FIG. 6.

Figure 6:
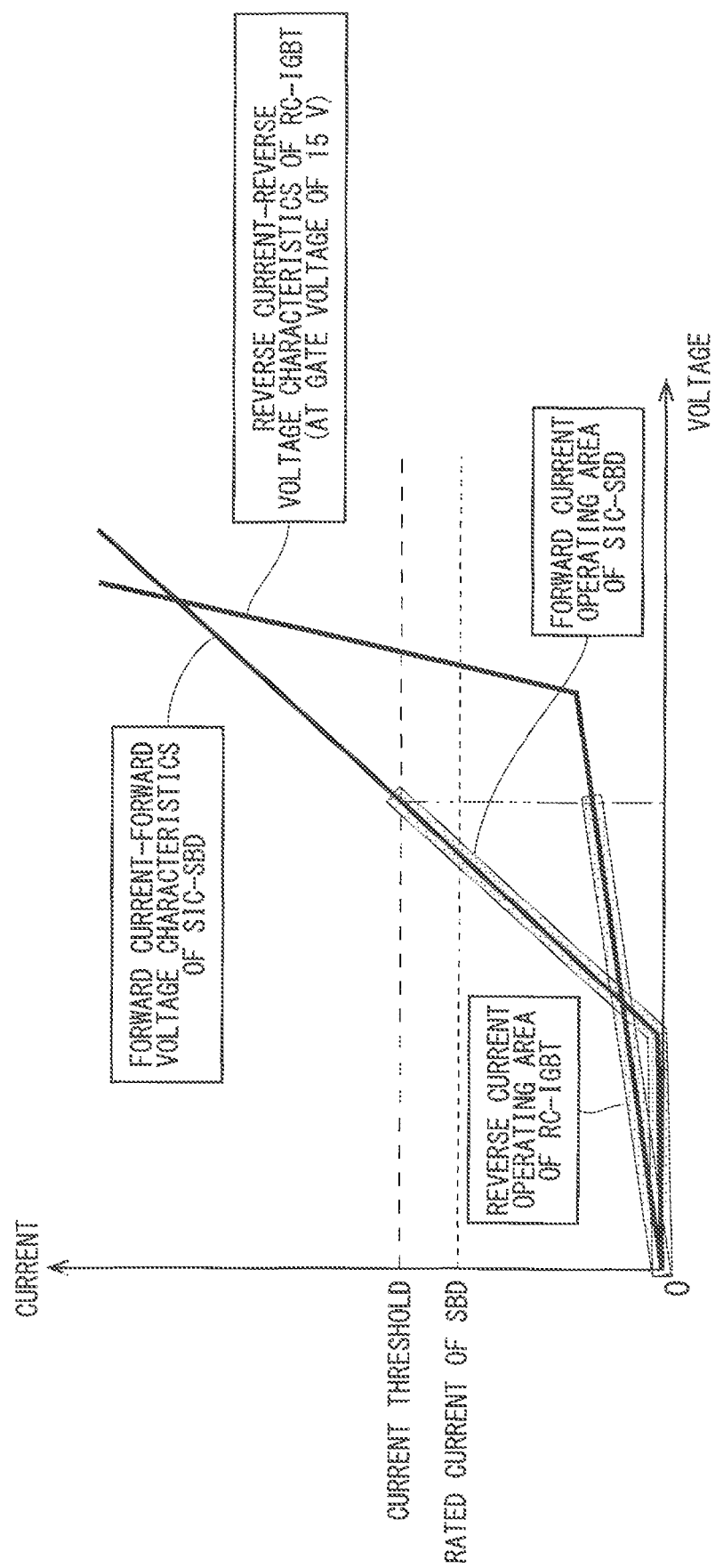
FIG. 6 illustrates states of sharing the freewheeling current of the inverter circuit according to Embodiment 1.

FIG. 6 illustrates states of sharing the freewheeling current between the RC-IGBT and the SiC-SBD before the OFF signal is supplied to the gate electrodes R12 of the transistor R5. The horizontal axis represents the voltage, and the vertical axis represents the current. FIG. 6 illustrates forward current-forward voltage characteristics of the SiC-SBD, and reverse current-reverse voltage characteristics of the RC-IGBT at the gate voltage of 15 V. The reverse current operating area of the RC-IGBT and the forward current operating area of the SiC-SBD are hatched. Furthermore, the current threshold and the rated current of the SBD are indicated by respective broken lines.

The product of the gate channel resistance and the current flowing through a gate channel is equal to a bias voltage to be applied to the p-n junction of the body diode of the transistor R5. Thus, unless the current flowing through the gate channel is large, the p-n junction does not reach a bipolar operation start voltage. When the gate voltage to be applied is high, the gate channel resistance decreases. Thus, the bias voltage to be applied to the p-n junction of the body diode is reduced, and the bipolar operation start voltage (a voltage at a diode operation start point) is increased. Even when the p-n junction does not reach the bipolar operation start voltage, a subtle freewheeling current flows through the transistor R5 via the gate channel.

In such a current-conduction state, the transistor R5 performs not bipolar operations to which both of electrons and holes contribute as current-conduction medium carriers, but unipolar operations to which only electrons contribute. When a device performing the unipolar operations transitions to reverse recovery operations, there is no accumulated excess carrier inside the device, that is, the n⁻ type base layer R10a. Thus, a depletion layer is immediately formed. Here, the reverse recovery time is extremely short, and the reverse recovery loss is small. Thus, the switching loss is small.

As previously described, when interruption to the current flow is initiated by turning OFF switching the transistor R5 in invertor operations, the load R4 representing the inductance attempts to continue to conduct the same current as before. Thus, the diode R7 and the body diode of the transistor R6 in which the OFF signal is supplied to the gate electrodes R12 are turned ON, and start to conduct the freewheeling current as the FWDs. However, until the voltage shared by the transistor R5 reaches the power supply voltage, the gate signal for turning ON the gate channel is not supplied to the transistor R6. In other words, while the transistor R5 is performing turn-off switching operations, the gate channel of the transistor R6 is not turned ON.

This is because if the ON signal is supplied to the transistor R6 before the transistor R5 completes the turn-off switching operations, the transistor R6 is turned ON, and the leg is short-circuited. This causes a large current to flow through the transistors R5 and R6, and creates malfunctions.

Thus, the inverter circuit 100 is controlled by confirming that the transistor R5 shares the power supply voltage and the freewheeling current flows through the diode R7, and then supplying the gate signal to the transistor R6 so that the freewheeling current branches. This can prevent short-circuiting the leg.

In the conducting operations of the freewheeling current through the diode R8, when the current flowing through the diode R8 is detected and the forward current (freewheeling current) flowing through the diode R8 exceeds the set current threshold, the control circuit CC supplies the gate electrodes R12 of the transistor R5 with, for example, an OFF signal of 0 V or minus several volts lower than or equal to the threshold voltage, and prevents supply of the ON signal to the gate electrodes R12 to turn OFF the gate channel. This cancels a function of maintaining the emitter electrode R19 (identical in potential to the p-type base layers R11a) and the n$^-$ type base layer R10a at the same potential through the gate channel resistance. This reduces the bipolar operation start voltage (voltage at the diode operation start point), and forward-biases the body diode of the transistor R5 including the p-type base layers R11a and the n$^-$ type base layer R10a. Thus, the reverse current (freewheeling current) flows from the emitter electrode R19 to the collector electrode R20 through the body diode (p-n junction). A current sensor, which is not illustrated, detects the currents flowing through the diodes R7 and R8, and feeds back the currents to the control circuit CC. Then, the control circuit CC processes the currents, and supplies the output signal. A known technology is applicable to this method.

In such a current-conduction state, the body diode of the transistor R5 performs the bipolar operations to which both of electrons and holes contribute as current-conduction medium carriers. The carriers are accumulated in the n$^-$ type base layer R10a, so that conductance modulation occurs and resistive components of the n$^-$ type base layer R10a significantly decrease. Thus, the forward voltage of the body diode of the transistor R5 becomes very low, and ON resistive components become very small.

The ON resistance of the diode R8 (the forward voltage (volt)/the current value (ampere)) is larger than a sum of resistive components of the emitter electrode R19, a pin diode (the p-type base layers R11a, the n$^-$ type base layer R10a, and the n-type buffer layer R16), the n$^+$ type collector layers R15, and the collector electrode R20 in the current path of the transistor R5. Thus, the freewheeling current is shared, so that most of the freewheeling current flows through the body diode of the transistor R5 as illustrated in FIG. 7.

Figure 7:
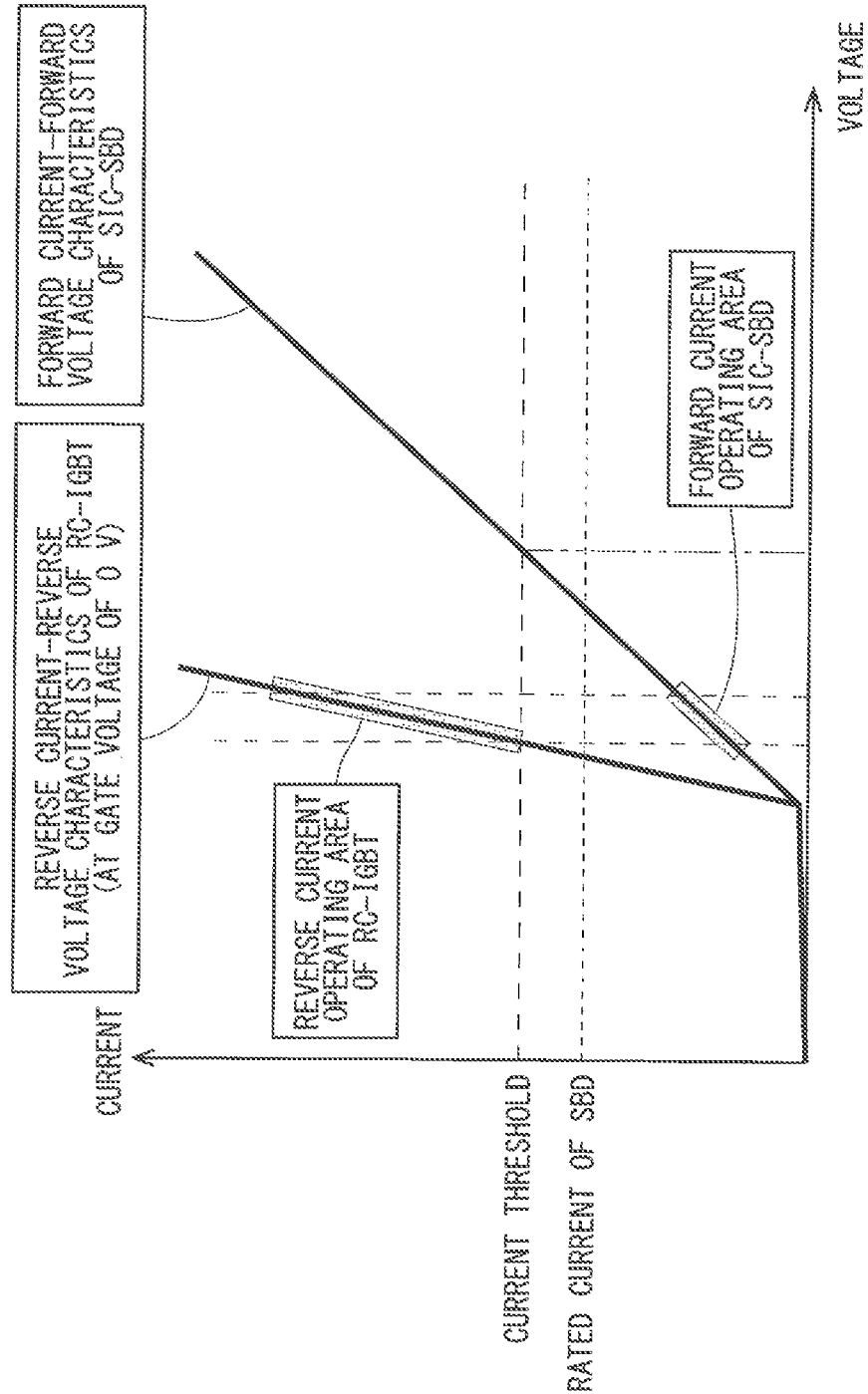
FIG. 7 illustrates states of sharing the freewheeling current of the inverter circuit according to Embodiment 1.

FIG. 7 illustrates states of sharing the freewheeling current between the RC-IGBT and the SiC-SBD when the OFF signal is supplied to the gate electrodes R12 of the transistor R5. The horizontal axis represents the voltage, and the vertical axis represents the current. FIG. 7 illustrates forward current-forward voltage characteristics of the SiC-SBD, and reverse current-reverse voltage characteristics of the RC-IGBT at the gate voltage of 0 V. The reverse current operating area of the RC-IGBT and the forward current operating area of the SiC-SBD are hatched. Furthermore, the current threshold and the rated current of the SBD are indicated by respective broken lines.

This operation is suitable for conducting a large current with a small loss. The large freewheeling current flowing through the body diode of the transistor R5 generates a large switching loss. However, since a part of the freewheeling current is branched into the diode R8, the freewheeling current has reverse recovery charge slightly smaller than that when the entire freewheeling current flows through the transistor R5, and has a smaller switching loss.

In addition, the time when the freewheeling current becomes large over the rated current is limited to the time in performing overload operations, for example, in starting operations. Thus, most of normal operations are performed with a current lower than or equal to the rated current. Since the overload operations are performed less frequently, the influence of the effect of reducing the switching loss in the normal operations is significant. This can implement a semiconductor device that avoids a risk of thermal breakdown caused by conducting a large current and that has a small switching loss in overall operations.

In the conducting operations of the freewheeling current through the diode R7, the freewheeling current flowing through the diode R7 is controlled in the same manner as that for the diode R8 described above.

Here, a rated current value of the diodes R7 and R8 is used as the current threshold for determining whether a gate signal has been supplied after a current flowing through the FWD is detected. Conducting an instantaneous current up to twice (twice or lower than) the rated current is permitted, whereas conducting a DC current up to the rated current is permitted.

Conducting the DC current over the rated current poses a risk of thermal breakdown. To prevent this, the current threshold is set between the rated current and a current double the rated current (twice or lower than the rated current). Thus, the risk of thermal breakdown is prevented, and the low loss is achieved.

Furthermore, when the forward voltage between main electrodes of the FWD, that is, an anode voltage with respect to the negative pole of the FWD is detected and the forward voltage exceeds a preset value (a voltage threshold), a combination with gating the inverter circuit 100 can further reduce the risk of thermal breakdown. Here, the control circuit CC detects the forward Voltages Of The Diodes R7 and R8. A known technology is applicable to this method.

As described above, the control circuit CC not only supplies the gate signals of the transistors R5 and R6, but also detects the forward currents and the forward voltages flowing through the diodes R7 and R8 and gates the inverter circuit 100 based on the detection results. Thus, a power conversion circuit including this control circuit CC is an Intelligent Power Module (IPM).

When the gate voltage is lower than the voltage threshold, the control circuit CC minimizes the freewheeling current branching to the RC-IGBT. In this case, the rated gate voltage is supplied to the gate electrodes R12, and the rising voltage (bipolar operation start voltage) of the forward current of a parasitic diode included in the RC-IGBT is preferably higher than or equal to 3 V. Since the parasitic diode does not perform bipolar operations with the rising voltage lower than or equal to 3 V, the freewheeling current branching to the RC-IGBT is small.

Since the diodes R8 and R7 perform unipolar operations, the ON resistance (forward voltage) increases upon increase in a temperature. When the forward voltages of the diodes R8 and R7 are lower than or equal to approximately 3 V of the voltage threshold, the rated current can flow through the diodes R8 and R7 at high temperatures. Here, when the forward voltages are lower than or equal to the voltage threshold (approximately 3 V), the ON signal to be supplied to the gate electrodes R12 is adjusted so that the body diode of the RC-IGBT does not perform bipolar operations. Furthermore, driving the diodes R8 and R7 is controlled so that most of the freewheeling current flows through the diodes R8 and R7. This control method can limit bipolar operations of the body diode of the RC-IGBT more than necessary, and reduce the switching loss.

FIG. 8 illustrates, as a list, gating the transistors R5 and R6, conduction states of the current flowing through the transistors R5 and R6 and the diodes R8 and R7, and the operation characteristics.

When the OFF signal (or no signal) is supplied to gate the RC-IGBTs, the RC-IGBTs in an OFF state and the SiC-SBDs in a reverse bias state are set to a voltage-blocking state. Thus, no current flows through the load.

When the ON signal is supplied to gate the RC-IGBTs, the RC-IGBTs are set to an ON state, and the collector conducts the current to the emitter. The SiC-SBDs in a reverse bias state are set to a voltage-blocking state. Thus, the ON current flowing through the RC-IGBTs flows through the load.

When the ON signal is supplied to gate the RC-IGBTs, the RC-IGBTs in a reverse-conducting state conduct an electron current from the emitter to the collector through a channel. The SiC-SBDs conduct the forward current (freewheeling current). In this state, the freewheeling current flowing from the load to the power supply is branched into the RC-IGBTs and the SBDs. Since the resistance through the channel of the RC-IGBTs is large, most of the current flows through the SBDs.

Even when the device performs reverse recovery operations from such a current-conduction state, the RC-IGBTs do not perform the bipolar operations. Thus, the reverse recovery loss is small.

When the OFF signal (or no signal) is supplied to gate the RC-IGBTs, the RC-IGBTs in a reverse-conducting state allow an electron current and a hole current to flow from the emitter to the collector through the body diodes. The SiC-SBDs conduct the forward current (freewheeling current). In this state, the freewheeling current flowing from the load to the power supply is branched into the RC-IGBTs and the SBDs. Since most of the freewheeling current flows through the body diodes of the RC-IGBTs whose forward voltage drop is low and which are performing bipolar operations, the device can conduct a large current. Since the body diodes of the RC-IGBTs are performing the bipolar operations, the reverse recovery loss is large.

Embodiment 2

[Device Structure]

Figure 9:
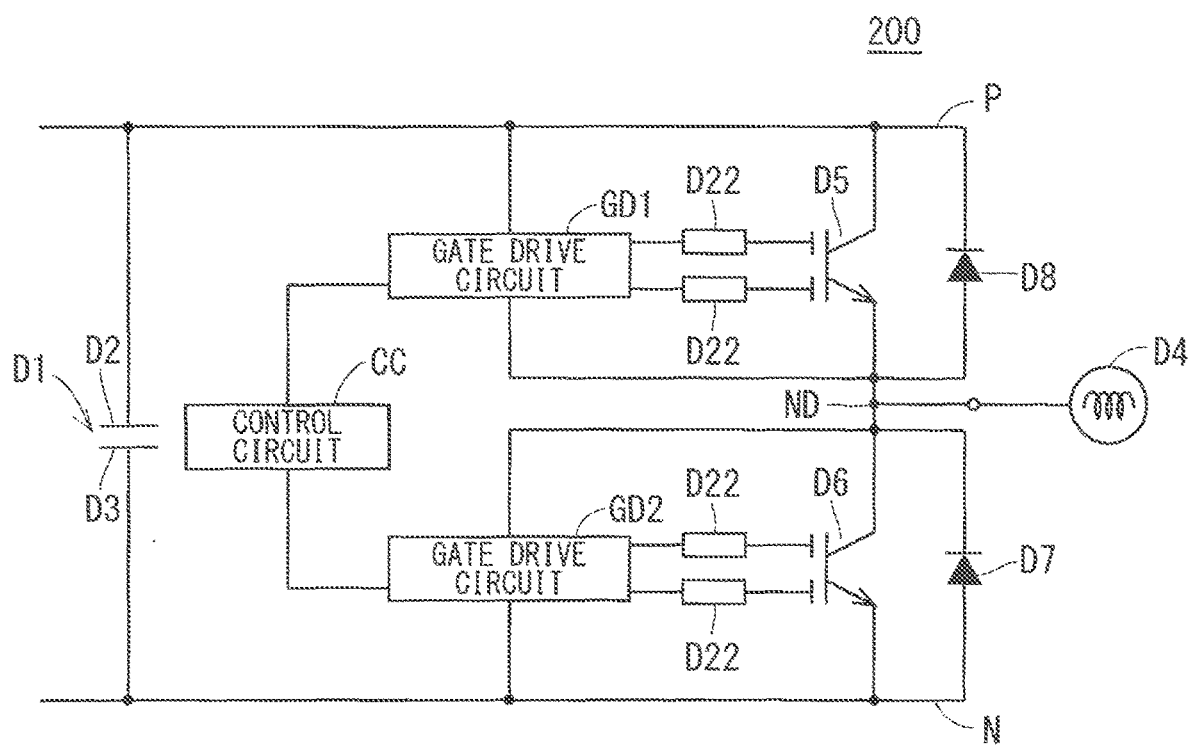
FIG. 9 is a circuit diagram illustrating an inverter circuit according to Embodiment 2.

FIG. 9 is a circuit diagram illustrating an inverter circuit 200 that is a semiconductor device according to Embodiment 2 of the present disclosure. In FIG. 9, the same reference numerals are attached to those of the inverter circuit 100 with the same structure which are described with reference to FIG. 1, and the overlapping description is omitted.

The inverter circuit 200 includes a DC voltage power supply device D1 including a positive electrode D2 and a negative electrode D3. The inverter circuit 200 converts the DC voltage supplied by the DC voltage power supply device D1 into an AC voltage for driving a single-phase load D4 representing an inductance.

In the inverter circuit 200, transistors D5 and D6 that are double-gate IGBTs are connected in series with each other between the electric power line P through which the potential (the first potential) of the positive electrode D2 in the DC voltage power supply device D1 is supplied and the electric power line N through which the potential (the second potential) of the negative electrode D3 in the DC voltage power supply device D1 is supplied, as illustrated in FIG. 9.

The double-gate IGBTs are a first IGBT operating as an IGBT, and a second IGBT operating as a diverging device for diverging the freewheeling current. Since gate signals are used as voltage signals in the double-gate IGBTs that are the first IGBT and the second IGBT, diverging operations can be adjusted by the magnitude of voltages of an ON signal and an OFF signal to be supplied to gate electrodes.

Diodes D8 and D7 that are SBDs containing SiC as a base material are anti-parallel connected to the transistors D5 and D6, respectively.

The transistor D5 connected to the electric power line P is the first arm, and the transistor D6 connected to the electric power line N is the second arm.

Current ratings of the diodes D8 and D7 are approximately less than or equal to halves those of the transistors D5 and D6, respectively. In other words, areas of active regions in a plan view through which forward currents of the diodes R8 and R7 flow are approximately less than or equal to halves areas of active regions in a plan view through which the principal currents of the transistors R5 and R6 flow, respectively. Thus, the diodes D8 and D7 functioning as FWDs are sufficiently downsized. Downsizing the diodes D8 and D7 can reduce the cost of using the diodes D8 and D7 containing an expensive wide bandgap semiconductor as a base material.

A connection node ND between the transistors D5 and D6 is connected to the load D4 as an output node.

Each of the transistors D5 and D6 includes two gate electrodes. The two gate electrodes of the transistor D5 are connected to a gate drive circuit GD1 through respective gate resistors D22. The two gate electrodes of the transistor D6 are connected to a gate drive circuit GD2 through respective gate resistors D22. The gate drive circuits GD1 and GD2 are connected to the control circuit CC. The control circuit CC supplies the gate drive circuits GD1 and GD2 with signals for controlling ON and OFF of the transistors D5 and D6, respectively.

The gate drive circuit GD1 operates between a potential of a power supply of the gate drive circuit GD1, a potential of the electric power line P, and a potential of the connection node ND, whereas the gate drive circuit GD2 operates between a potential of a power supply of the gate drive circuit GD2, a potential of the electric power line N, and the potential of the connection node ND.

Figure 10:
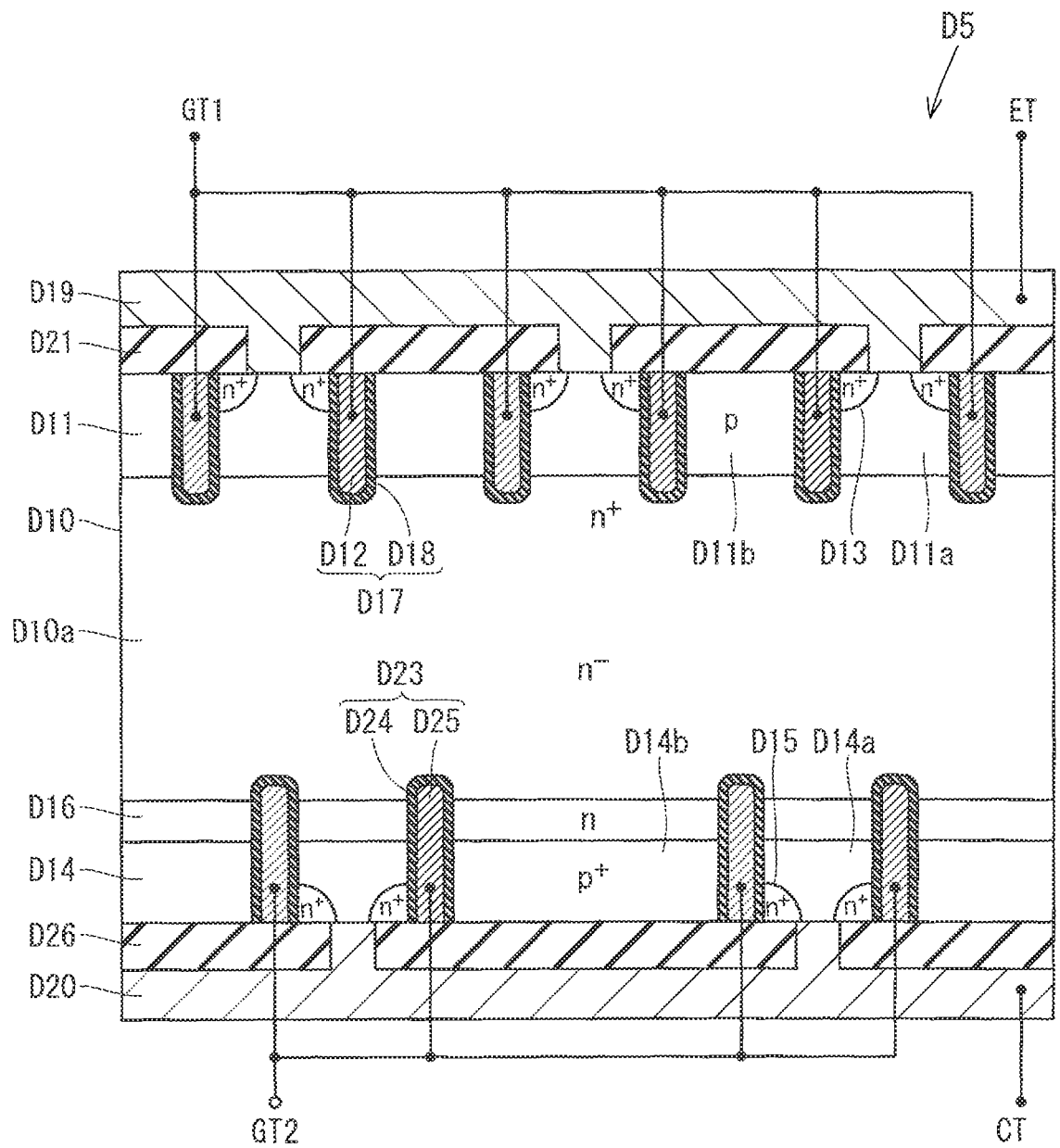
FIG. 10 is a cross-sectional view illustrating a structure of a transistor of the inverter circuit according to Embodiment 2.

FIG. 10 is a cross-sectional view illustrating a structure of the transistor D5. The transistor D6 has the same structure. Since the diode D8 has the same structure as that of the diode R8 illustrated in FIG. 2, the illustration is omitted.

The structure of the emitter of the double-gate IGBT is identical to that of the emitter of the RC-IGBT. For example, an n-type (n⁻) single crystal bulk silicon substrate (an FZ wafer) whose impurity concentration is approximately $1 \times 10^{14}$ cm$^{-3}$ is used as a semiconductor substrate D10. This semiconductor substrate D10 functions as an n⁻ type base layer D10a.

A p-type base layer D11 of p-type (p) is formed in a surface portion of an upper surface (a first principal surface) of the semiconductor substrate D10 which includes an emitter electrode D19. A plurality of trenches D17 (first trenches) penetrating the p-type base layer D11 from the first principal surface of the semiconductor substrate D10 and each having a bottom reaching into the semiconductor substrate D10 are selectively formed in this p-type base layer D11. An inner surface of each of the trenches D17 is covered with a gate insulating film D18. Each of the trenches D17 covered with the gate insulating film D18 is filled with, for example, polysilicon whose impurity concentration is approximately $1\times10^{20}$ cm$^{-3}$ to form a gate electrode D12 (a first gate electrode). The gate electrode D12 receives a driving signal (a first switching signal) for driving the first IGBT through a gate terminal GT1.

N$^+$ type emitter layers D13 of n-type (n$^+$) are selectively formed in an upper layer portion of the p-type base layer D11 with a mesa shape partitioned by the trenches D17, to be adjacent to parts of side surfaces of the trenches D17. Each of the n$^+$ type emitter layers D13 has a thickness of approximately 0.5 μm, and an impurity concentration of approximately $3\times10^{19}$ cm$^{-3}$.

A p-type base layer D11a (a first p-type base layer) that is a p-type base layer including the n$^+$ type emitter layers D13 is distinguished from a p-type base layer D11b (a second p-type base layer) that is a p-type base layer excluding the n$^+$ type emitter layers D13. The p-type base layer D11a and the p-type base layer D11b are alternately formed.

The p-type base layers D11a including the n$^+$ type emitter layers D13 are electrically connected to the emitter electrode D19. An emitter potential is applied to the emitter electrode D19 through the emitter terminal ET.

The p-type base layers D11a facing the gate electrodes D12 through the gate insulating films D18 function as a channel formation region (a first channel formation region) of the IGBT.

Most of the surface of the p-type base layers D11b is covered with an insulating film D21. Only a portion of the surface that is not covered with the insulating film D21 (not illustrated) is connected to the emitter electrode D19 for clamping voltages. The connection area of the portion is small, and the portion has a resistive component.

A p$^+$ type collector layer D14 of p-type (p$^+$) is formed in a surface portion of a lower surface (a second principal surface) of the semiconductor substrate D10 which includes a collector electrode D20. The p$^+$ type collector layer D14 has a thickness of approximately 2.0 μm, and an impurity concentration of approximately $1\times10^{18}$ s cm$^{-3}$.

An n-type buffer layer D16 of n-type (n) that prevents extension of a depletion layer is formed between the p$^+$ type collector layer D14 and the semiconductor substrate D10. The n-type buffer layer D16 has a thickness of approximately 2.0 μm, and an impurity concentration of approximately $2\times10^{16}$ cm$^{-3}$.

A plurality of trenches D23 (second trenches) penetrating the p$^+$ type collector layer D14 and the n-type buffer layer D16 from the lower surface of the semiconductor substrate D10 and each having a bottom reaching into the n$^-$ type base layer D10a are selectively formed. An inner surface of each of the trenches D23 is covered with a gate insulating film D24. Each of the trenches D23 covered with the gate insulating film D24 is filled with, for example, polysilicon whose impurity concentration is approximately $1\times10^{20}$ cm$^{-3}$ to form a gate electrode D25 (a second gate electrode). The gate electrode D25 receives a driving signal (a second switching signal) for driving the second IGBT operating as the diverging device, through a gate terminal GT2.

N$^+$ type collector layers D15 of n-type (n$^+$) are selectively formed in a lower layer portion of the p$^+$ type collector layer D14 with a mesa shape partitioned by the trenches D23, to be adjacent to parts of side surfaces of the trenches D23. Each of the n$^+$ type collector layers D15 has a thickness of approximately 0.5 μm, and an impurity concentration of approximately $3\times10^{19}$ cm$^{-3}$.

A p$^+$ type collector layer D14a (a first p$^+$ type collector layer) that is a p$^+$ type collector layer including the n$^+$ type collector layers D15 is distinguished from a p$^+$ type collector layer D14b (a second p$^+$ type collector layer) that is a p$^+$ type collector layer excluding the n$^+$ type collector layers D15. The p$^+$ type collector layer D14a and the p$^+$ type collector layer D14b are alternately formed.

An insulating film D26 is formed on the lower surface of the semiconductor substrate D10. The collector electrode D20 is formed on the insulating film D26.

The collector electrode D20 penetrates the insulating film D26 to be electrically connected to the n$^+$ type collector layers D15 and the p$^+$ type collector layers D14a. A collector potential is applied to the collector electrode D20 through the collector terminal CT.

The p$^+$ type collector layers D14a facing the gate electrodes D25 through the gate insulating films D24 function as a channel formation region (a second channel formation region) of the IGBT.

Most of the surface of the p$^+$ type collector layer D14b is covered with the insulating film D26. Only a portion of the surface that is not covered with the insulating film D26 (not illustrated) is connected to the collector electrode D20 for clamping voltages. The connection area of the portion is small, and the portion has a resistive component.

A thickness from the top surface of the p-type base layer D11, that is, the upper surface of the semiconductor substrate D10 to the bottom surface of the p$^+$ type collector layer D14, that is, the lower surface of the semiconductor substrate D10 is approximately 120 μm.

[Functions]

Functions of the inverter circuit 200 will be hereinafter described with reference to FIGS. 9 and 10. Supplying the ON signal to the gate electrodes D25 of the transistor D5 that is a double-gate IGBT opens a gate channel. Thus, the n-type buffer layer D16 is conductively connected to the n$^+$ type collector layers D15. This conduction allows the n$^+$ type collector layers D15 to function as an n$^+$ type cathode layer of the IGBT. Thus, supplying the ON signal to the gate electrodes D25 allows the transistors D5 and D6 to operate as FWDs. In other words, supplying the OFF signal to the gate electrodes D25 does not allow the transistors D5 and D6 to operate as FWDs, whereas supplying the ON signal to the gate electrodes D25 allows the transistors D5 and D6 to operate as FWDs.

As such, gating the gate electrodes D25 allows the double-gate IGBT to diverge the freewheeling current flowing through the diode D8. Thus, the double-gate IGBT functions as a bidirectional current-conduction device that can control a large current at a low cost and perform high-frequency operations with a low loss.

Figure 11:
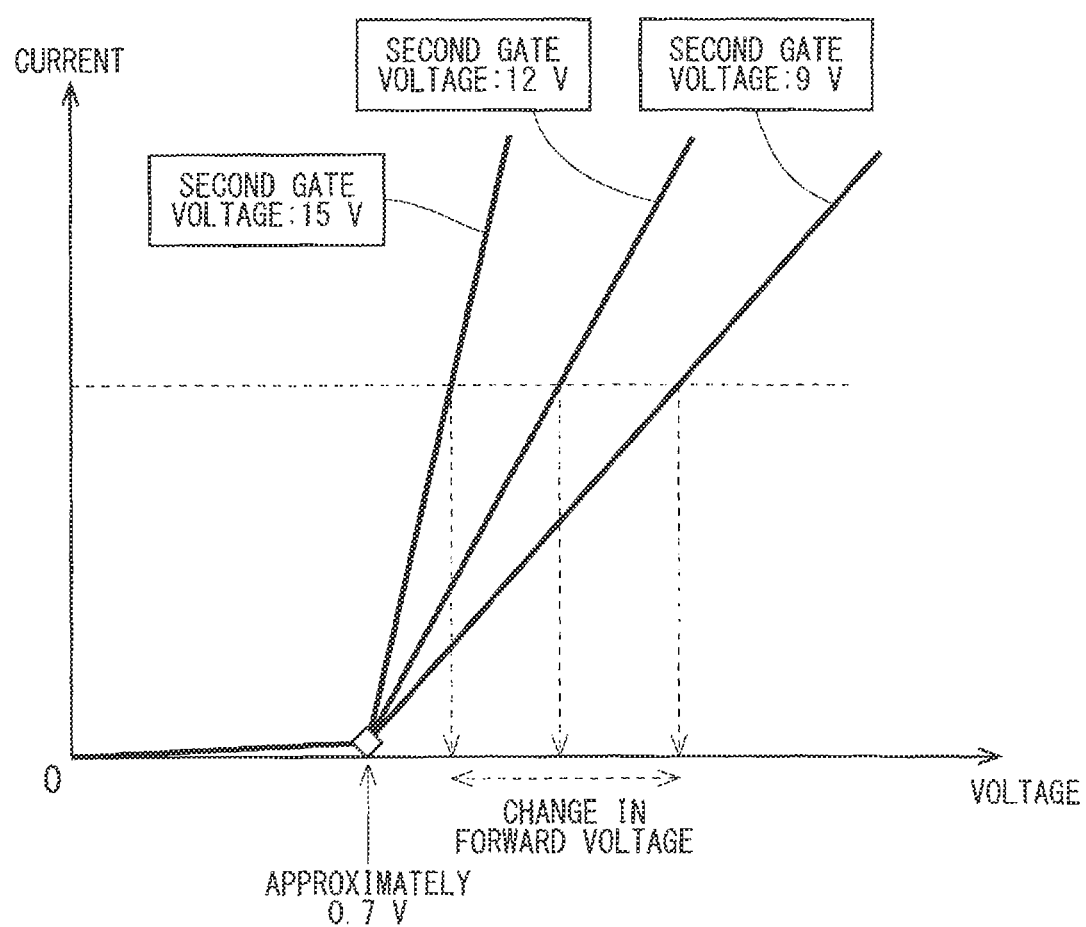
FIG. 11 illustrates dependence of forward voltage-forward current characteristics on gate voltages when the transistor of the inverter circuit according to Embodiment 2 operates as a FWD.

FIG. 11 illustrates dependence of forward voltage-forward current characteristics on second gate voltages when double-gate IGBTs operate as FWDs. FIG. 11 illustrates the forward voltage of the FWD on the horizontal axis when an emitter takes a positive voltage with respect to a collector of the IGBT, and illustrates the forward current of the FWD that flows from the emitter to the collector of the IGBT on the vertical axis.

FIG. 11 illustrates three characteristics when the second gate voltages to be supplied to a second gate are 9 V, 12 V, and 15 V. In any of the characteristics, the voltage with which a current starts to flow (the voltage at the bipolar operation start point) is approximately 0.7 volt.

FIG. 11 shows that an increase in a voltage to be supplied to the gate electrodes D25 can reduce the gate channel resistance and the forward voltage in conducting a current. Changing the forward voltage of the FWD means changing the ON resistive component of the FWD, and enabling, in conducting a large freewheeling current, adjustment of a ratio of the freewheeling currents flowing through the transistors R5 and R6 and the diodes R8 and R7 using voltage signals supplied to the gate electrodes D25.

When the current flowing through the diode D8 is detected and the forward current (freewheeling current) flowing through the diode D8 exceeds the set current threshold, the control circuit CC supplies the gate electrodes D25 of the transistor D5 with, for example, an ON signal of 15 V to turn ON and open the gate channel. Consequently, the collector electrode D20 connected to the n$^+$ type collector layers D15 through the gate channel resistance is conductively connected to the n$^-$ type base layer D10a. The p-n junction of the p-type base layers D11a and the n$^-$ type base layer D10a functions as a FWD through which a large freewheeling current can flow. Thus, the freewheeling current flowing through the diode D8 can be diverged to the transistor D5. Supplying the gate electrodes D25 with an ON signal of approximately 15 V which is closer to the rated gate voltage sufficiently reduces the gate channel resistance. Thus, most of the freewheeling current flows through the transistor D5.

Since the p-n junctions functioning as FWDs of the transistors D5 and D6 perform bipolar operations, the reverse recovery charge and the switching loss are large. Here, when the freewheeling currents flowing through the diodes D8 and D7 amount to the extent that causes no risk of thermal breakdown, supplying the OFF signal to the gate electrodes D25 of the transistors D5 and D6 and closing the gate channel to prevent the transistors D5 and D6 from functioning as FWDs prevent the freewheeling currents from flowing through the transistors D5 and D6, and are effective at reducing the switching loss.

When the forward currents (freewheeling currents) flowing through the diodes D7 and D8 exceed the set current threshold, supplying the ON signal to the gate electrodes D25 diverges the freewheeling currents. Moreover, an ON signal whose voltage has been adjusted so that the detected freewheeling currents fall slightly below the current threshold is supplied to the gate electrodes D25. Here, "fall slightly below the current threshold" means controlling the freewheeling currents within a range from 70% to 90% of the current threshold.

The inverter circuit 200 is controlled by adjusting a branching ratio of the freewheeling currents flowing through the diodes D8 and D7 and the freewheeling currents flowing through the FWDs included in the transistors D5 and D6 using the ON signal to be supplied to the gate electrodes D25, so that the freewheeling currents flowing through the diodes D8 and D7 are maximized to the extent that causes no risk of thermal breakdown. This control can further reduce the switching loss.

Changing a voltage to be supplied to the gate electrodes D12 in each of the transistors D5 and D6 that are double-gate IGBTs similarly to those in the transistors R5 and R6 that are RC-IGBTs can move the bipolar operation start point, and change the forward voltage. However, the differential resistance (dV/dI) defined by the amount of change in forward voltage/the amount of change in forward current in an area exceeding the bipolar operation start point is small, and the fine adjustment is difficult.

On the other hand, changing a voltage to be supplied to the gate electrodes D25 in each of the transistors D5 and D6 can change the differential resistance (dV/dI). Supplying a high gate voltage to the gate electrodes D25 reduces the gate channel resistance, whereas supplying a low gate voltage to the gate electrodes D25 increases the gate channel resistance. Since the gate channel resistance component is an element for determining the differential resistance (dV/dI), the differential resistance can be adjusted. This effect facilitates controlling the forward voltage in the transistors D5 and D6 as the FWDs.

Changing the voltage to be supplied to the gate electrodes D25 with this adjustment function enables the freewheeling current as large as possible to flow through the diodes D8 and D7 while the freewheeling current falls slightly below the current threshold.

Inhibiting the current in the bipolar operations of the transistors D5 and D6 as the FWDs can reduce a loss in the switching operations.

Here, the inverter circuit 200 is also controlled by confirming that the transistor D5 shares the power supply voltage and the freewheeling current flows through the diode D7, and then supplying the gate signal to the transistor D6 so that the freewheeling current branches. This can obviously prevent short-circuiting the leg.

[Other Applications]

Although connecting discrete semiconductor devices in series with each other forms a leg of an inverter circuit in Embodiments 1 and 2 described above, using a plurality of semiconductor devices connected in series with or in parallel with each other as the discrete semiconductor devices can produce the same advantages as previously described.

Furthermore, a single bidirectional current-conduction device obtained by connecting bidirectional current-conduction devices in series-parallel, or a single diode obtained by connecting, in series-parallel, diodes anti-parallel connected to bidirectional current-conduction devices can produce the same advantages as previously described.

The present disclosure is directed to a semiconductor device in which bidirectional current-conduction devices containing a silicon semiconductor are combined with diodes whose base material is a wide bandgap semiconductor material as a base material, and to a driving method thereof. Obviously, bidirectional current-conduction devices whose base material is a semiconductor material other than silicon, Schottky barrier diodes containing a silicon semiconductor which are smaller than p-n junction diodes containing silicon with general reverse recovery charge, and junction diodes to which the lifetime control has been applied and whose base material is a silicon semiconductor, for example, p-n junction diodes, and pin-type diodes including p-type semiconductors, intrinsic semiconductors, and n-type semiconductors can also produce the same advantages as previously described.

Embodiments in the present disclosure can be freely combined, and appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device, comprising:
a bidirectional current-conduction device including a transistor, and a body diode included in the transistor so that the body diode is anti-parallel to the transistor; and a diode anti-parallel connected to the bidirectional current-conduction device, wherein the bidirectional current-conduction device allows a first current and a second current to flow, and allows at least the second current to switch between conduction and non-conduction, the first current flowing in a first direction from a first main electrode of the transistor to a second main electrode facing the first main electrode, the second current flowing through the body diode in a second direction opposite to the first direction, and the diode is smaller in area than the bidirectional current-conduction device in a plan view.

2. The semiconductor device according to claim 1, comprising a controller switching the bidirectional current-conduction device to a state of conducting the second current when a forward current flowing through the diode in a forward direction is detected and the forward current exceeds a current threshold or when a forward voltage applied to the diode is detected and the forward voltage exceeds a voltage threshold.

3. The semiconductor device according to claim 2, wherein the controller switches the bidirectional current-conduction device to a state of non-conducting the second current when the forward current is less than the current threshold or when the forward voltage is less than the voltage threshold.

4. The semiconductor device according to claim 2, wherein the current threshold is set between a rated current of the diode and a current double the rated current.

5. The semiconductor device according to claim 2, wherein the voltage threshold is set less than or equal to 3 V.

6. The semiconductor device according to claim 5, wherein when supplying a rated gate voltage of the transistor to a gate as a signal for switching the bidirectional current-conduction device to the state of non-conducting the second current, the controller sets, to more than or equal to 3 V, a rising voltage of the second current flowing through the body diode when the rated gate voltage is supplied.

7. The semiconductor device according to claim 1, wherein the area of the diode is smaller than or equal to a half the area of the bidirectional current-conduction device in the plan view, or a rated current of the diode is less than or equal to a half a rated current of the bidirectional current-conduction device.

8. The semiconductor device according to claim 2, wherein the body diode is a p-n junction diode, and the transistor is a metal-oxide-semiconductor transistor or a reverse-conducting insulated gate bipolar transistor.

9. The semiconductor device according to claim 8, wherein the controller adjusts a voltage value of a signal for switching the bidirectional current-conduction device to a state of non-conducting the second current so that the forward current flowing through the diode is maximized, when the forward current is less than the current threshold or when the forward voltage is less than the voltage threshold.

10. The semiconductor device according to claim 8, wherein an impurity layer corresponding to an anode layer of the body diode in the bidirectional current-conduction device has an impurity concentration higher than or equal to $6\times10^{17}$ $cm^{-3}$.

11. The semiconductor device according to claim 1, wherein the diode is a Schottky barrier diode containing a wide bandgap semiconductor, or a junction diode to which lifetime control has been applied and which contains a silicon semiconductor.

12. A semiconductor device, comprising:

a first bidirectional current-conduction device including a first transistor, and a first body diode included in the first transistor so that the first body diode is anti-parallel to the first transistor;

a first diode anti-parallel connected to the first bidirectional current-conduction device;

a second bidirectional current-conduction device including a second transistor, and a second body diode included in the second transistor so that the second body diode is anti-parallel to the second transistor; and a second diode anti-parallel connected to the second bidirectional current-conduction device, wherein the first bidirectional current-conduction device allows a first current and a second current to flow, and allows at least the second current to switch between conduction and non-conduction, the first current flowing in a first direction from a first main electrode of the first transistor to a second main electrode facing the first main electrode, the second current flowing through the first body diode in a second direction opposite to the first direction, the second bidirectional current-conduction device allows a first current and a second current to flow, and allows at least the second current to switch between conduction and non-conduction, the first current flowing in a first direction from a first main electrode of the second transistor to a second main electrode facing the first main electrode, the second current flowing through the second body diode in a second direction opposite to the first direction, the first bidirectional current-conduction device and the second bidirectional current-conduction device are connected in series with each other between a first potential and a second potential lower than the first potential, the first diode is smaller in area than the first bidirectional current-conduction device in a plan view, and the second diode is smaller in area than the second bidirectional current-conduction device in the plan view.

13. The semiconductor device according to claim 12, comprising a controller detecting a forward current flowing through the first and second diodes in a forward direction or a forward voltage applied to the first and second diodes, switching the first bidirectional current-conduction device to a state of conducting the second current when the forward current of the first diode exceeds a current threshold or when the forward voltage of the first diode exceeds a voltage threshold, and switching the second bidirectional current-conduction device to the state of conducting the second current when the forward current of the second diode exceeds the current threshold or when the forward voltage of the second diode exceeds the voltage threshold, wherein the first and second transistors are metal-oxide-semiconductor transistors or reverse-conducting insulated gate bipolar transistors, and the controller sets the first bidirectional current-conduction device to the state of conducting the second current during a turn-off switching operation of the second bidirectional current-conduction device when the forward current of the first diode is less than the current threshold or when the forward voltage of the first diode is less than the voltage threshold.

14. The semiconductor device according to claim 12, wherein the first and second diodes area Schottky barrier diodes containing a wide bandgap semiconductor, or junction diodes to which lifetime control has been applied and which contain a silicon semiconductor.

15. A semiconductor device, comprising:
a bidirectional current-conduction device including:
 a first main electrode and a second main electrode facing the first main electrode;
 a transistor including a first gate electrode disposed closer to the first main electrode and receiving a first switching signal for switching between conduction and non-conduction of a first current flowing in a first direction from the first main electrode to the second main electrode; and
 a device including a second gate electrode disposed closer to the second main electrode and receiving a second switching signal for switching between conduction and non-conduction of a second current flowing in a second direction opposite to the first direction; and
a diode anti-parallel connected to the bidirectional current-conduction device,
wherein the diode is smaller in area than the bidirectional current-conduction device in a plan view.

16. The semiconductor device according to claim 15, wherein the transistor and the device am insulated gate bipolar transistors.

17. The semiconductor device according to claim 15, comprising
a controller supplying, to the second gate electrode as the second switching signal, a signal for switching the bidirectional current-conduction device to a state of conducting the second current when a forward current flowing through the diode in a forward direction is detected and the forward current exceeds a current threshold or when a forward voltage applied to the diode is detected and the forward voltage exceeds a voltage threshold.

18. The semiconductor device according to claim 17, wherein the controller adjusts voltage values of the first and second switching signals of the bidirectional current-conduction device so that the forward current flowing through the diode is maximized, when the forward current is less than the current threshold or when the forward voltage is less than the voltage threshold.

19. The semiconductor device according to claim 15, wherein the diode is a Schottky barrier diode containing a wide bandgap semiconductor, or a junction diode to which lifetime control has been applied and which contains a silicon semiconductor.

20. A semiconductor device, comprising:
a first bidirectional current-conduction device including;
 a first main electrode and a second main electrode facing the first main electrode;
 a first transistor including a first gate electrode disposed closer to the first main electrode and receiving a first switching signal for switching between conduction and non-conduction of a first current flowing in a first direction from the first main electrode to the second main electrode; and
 a first device including a second gate electrode disposed closer to the second main electrode and receiving a second switching signal for switching between conduction and non-conduction of a second current flowing in a second direction opposite to the first direction;
a first diode anti-parallel connected to the first bidirectional current-conduction device;
a second bidirectional current-conduction device including;
 a first main electrode and a second main electrode facing the first main electrode;
 a second transistor including a first gate electrode disposed closer to the first main electrode and receiving a first switching signal for switching between conduction and non-conduction of a first current flowing in a first direction from the first main electrode to the second main electrode;
 a second device including a second gate electrode disposed closer to the second main electrode and receiving a second switching signal for switching between conduction and non-conduction of a second current flowing in a second direction opposite to the first direction; and
a second diode anti-parallel connected to the second bidirectional current-conduction device,
wherein the first bidirectional current-conduction device and the second bidirectional current-conduction device are connected in series with each other between a first potential and a second potential lower than the first potential,
the first diode is smaller in area than the first bidirectional current-conduction device in a plan view, and
the second diode is smaller in area than the second bidirectional current-conduction device in the plan view.

21. The semiconductor device according to claim 20, comprising
a controller detecting a forward current flowing through the first and second diodes in a forward direction or a forward voltage applied to the first and second diodes, supplying, to the second gate electrode of the first bidirectional current-conduction device as the second switching signal, a signal for switching the first bidirectional current-conduction device to a state of conducting the second current when the forward current of the first diode exceeds a current threshold or when the forward voltage of the first diode exceeds a voltage threshold, and supplying, to the second gate electrode of the second bidirectional current-conduction device as the second switching signal, a signal for switching the second bidirectional current-conduction device to the state of conducting the second current when the forward current of the second diode exceeds the current threshold or when the forward voltage of the second diode exceeds the voltage threshold,
wherein the controller supplies, to the second gate electrode of the first bidirectional current-conduction device as the second switching signal, the signal for switching the first bidirectional current-conduction device to the state of conducting the second current when the forward current of the first diode is less than the current threshold, when the forward voltage of the first diode is less than the voltage threshold, and when the second bidirectional current-conduction device is performing an operation other than a turn-off switching operation.

22. The semiconductor device according to claim 20, wherein the first and second diodes area Schottky barrier diodes containing a wide bandgap semiconductor, or junction diodes to which lifetime control has been applied and which contain a silicon semiconductor.

\* \* \* \* \*